(12) United States Patent
Muramatsu et al.

(10) Patent No.: US 10,573,556 B2
(45) Date of Patent: Feb. 25, 2020

(54) WIRING STRUCTURE AND METHOD FOR PRODUCING WIRING STRUCTURE

(71) Applicant: HAMAMATSU PHOTONICS K.K., Hamamatsu-shi, Shizuoka (JP)

(72) Inventors: Masaharu Muramatsu, Hamamatsu (JP); Hisanori Suzuki, Hamamatsu (JP); Yasuhito Yoneta, Hamamatsu (JP); Shinya Otsuka, Hamamatsu (JP); Hirotaka Takahashi, Hamamatsu (JP)

(73) Assignee: HAMAMATSU PHOTONICS K.K., Hamamatsu-shi, Shizuoka (JP)

( * ) Notice: Subject to any disclaimer, the term of this patent is extended or adjusted under 35 U.S.C. 154(b) by 0 days.

(21) Appl. No.: 15/765,536

(22) PCT Filed: Sep. 1, 2016

(86) PCT No.: PCT/JP2016/075681
§ 371 (c)(1),
(2) Date: Apr. 3, 2018

(87) PCT Pub. No.: WO2017/061194
PCT Pub. Date: Apr. 13, 2017

(65) Prior Publication Data
US 2019/0080911 A1 Mar. 14, 2019

(30) Foreign Application Priority Data
Oct. 5, 2015 (JP) ................. 2015-197520

(51) Int. Cl.
*H01L 21/768* (2006.01)
*H01L 23/48* (2006.01)
(Continued)

(52) U.S. Cl.
CPC .... *H01L 21/76898* (2013.01); *H01L 21/3205* (2013.01); *H01L 21/486* (2013.01); *H01L 23/12* (2013.01); *H01L 23/14* (2013.01); *H01L 23/32* (2013.01); *H01L 23/481* (2013.01); *H01L 23/49827* (2013.01); *H01L 23/49872* (2013.01); *H01L 23/522* (2013.01); *H01L 23/5384* (2013.01); *H05K 1/11* (2013.01); *H05K 3/40* (2013.01)

(58) Field of Classification Search
CPC ............. H01L 23/481; H01L 23/49827; H01L 23/5384; H01L 21/486; H01L 21/76898; H01L 21/768; H01L 21/3205; H05K 3/40
See application file for complete search history.

(56) References Cited

U.S. PATENT DOCUMENTS

2005/0029630 A1* 2/2005 Matsuo ............. H01L 21/30604
257/628
2011/0241061 A1* 10/2011 Yu ...................... H01L 21/6835
257/99
(Continued)

FOREIGN PATENT DOCUMENTS

JP 2002-237468 A 8/2002
JP 2004-296488 A 10/2004
(Continued)

OTHER PUBLICATIONS

International Preliminary Report on Patentability dated Apr. 19, 2018 for PCT/JP2016/075681.

*Primary Examiner* — Joseph C. Nicely
(74) *Attorney, Agent, or Firm* — Drinker Biddle & Reath LLP

(57) ABSTRACT

Provided is a wiring structural body provided with a wiring pattern including a through-wiring pattern, the wiring structural body including: a silicon substrate having a through hole in which the through-wiring pattern is disposed; an insulating layer provided on a surface of the silicon substrate including an inner surface of the through hole along at least the wiring pattern; a boron layer provided on the insulating layer along the wiring pattern; and a metal layer provided on the boron layer.

9 Claims, 9 Drawing Sheets

(51) Int. Cl.
*H01L 23/498* (2006.01)
*H01L 23/538* (2006.01)
*H01L 21/48* (2006.01)
*H01L 23/14* (2006.01)
*H01L 21/3205* (2006.01)
*H01L 23/522* (2006.01)
*H05K 1/11* (2006.01)
*H01L 23/12* (2006.01)
*H01L 23/32* (2006.01)
*H05K 3/40* (2006.01)

(56) References Cited

U.S. PATENT DOCUMENTS

| | | | |
|---|---|---|---|
| 2012/0007154 A1* | 1/2012 | Lin | H01L 21/76898 |
| | | | 257/288 |
| 2012/0133010 A1* | 5/2012 | Komukai | H01L 27/1463 |
| | | | 257/432 |
| 2014/0138848 A1* | 5/2014 | Matsuura | H01L 21/76898 |
| | | | 257/774 |
| 2014/0339702 A1* | 11/2014 | Woychik | H01L 23/481 |
| | | | 257/762 |
| 2016/0258078 A1* | 9/2016 | Thorum | C25D 7/123 |
| 2016/0351450 A1* | 12/2016 | Migita | H01L 21/76898 |
| 2017/0229533 A1* | 8/2017 | Deligianni | H01L 28/10 |

FOREIGN PATENT DOCUMENTS

| | | |
|---|---|---|
| JP | 2007-5403 A | 1/2007 |
| JP | 2010-192481 A | 9/2010 |
| JP | 2011-192884 A | 9/2011 |
| JP | 2012-119381 A | 6/2012 |
| JP | 2013-207006 A | 10/2013 |

* cited by examiner

WIRING STRUCTURE AND METHOD FOR PRODUCING WIRING STRUCTURE

TECHNICAL FIELD

The present disclosure relates to a wiring structural body provided with a wiring pattern and a method for producing the wiring structural body.

BACKGROUND ART

There is known a semiconductor device including a silicon substrate having a through hole in which a through-wiring pattern is arranged, an insulating layer provided on a surface of the silicon substrate including an inner surface of the through hole, and a metal layer provided on the insulating layer on the inner surface of the through hole (refer to, for example, Patent Literature 1).

CITATION LIST

Patent Literature

Patent Literature 1: Japanese Unexamined Patent Publication No. 2012-119381

SUMMARY OF INVENTION

Technical Problem

In a wiring structural body provided with a through-wiring pattern as in the semiconductor device described above, how to reliably achieve the electrical connection in the through-wiring pattern is an issue.

An object of an aspect of the present disclosure is to provide a wiring structural body in which electrical connection in a through-wiring pattern is reliably achieved and a method for producing the wiring structural body capable of easily producing such a wiring structural body.

Solution to Problem

According to an aspect of the present disclosure, there is provided a wiring structural body provided with a wiring pattern including a through-wiring pattern, the wiring structural body including: a silicon substrate having a through hole in which the through-wiring pattern is disposed; an insulating layer provided on a surface of the silicon substrate including an inner surface of the through hole along at least the wiring pattern; a boron layer provided on the insulating layer along the wiring pattern; and a metal layer provided on the boron layer.

In this wiring structural body, a metal layer is formed on the insulating layer on the inner surface of the through hole with a boron layer interposed therebetween. This configuration is based on the findings that the present inventors have found that the metal layer is stably formed on the boron layer. As a result, in this wiring structural body, electrical connection in the through-wiring pattern is reliably achieved.

In the wiring structural body according to one embodiment of the present disclosure, at least a portion of the inner surface of the through hole may be along the thickness direction of the silicon substrate. In a case where at least a portion of the inner surface of the through hole is along the thickness direction of the silicon substrate, it is difficult to form the metal layer on the portion of the inner surface by, for example, a vapor deposition such as evaporation or sputtering. Because the metal layer is formed on the insulating layer on the inner surface of the through hole with the boron layer interposed therebetween, even in such a case, the metal layer is stably formed on the inner surface of the through hole, and electrical connection in the through-wiring pattern is reliably achieved.

In the wiring structural body according to one embodiment of the present disclosure, at least a portion of the inner surface of the through hole may be along a direction intersecting the thickness direction of the silicon substrate. In a case where at least a portion of the inner surface of the through hole is along a direction intersecting the thickness direction of the silicon substrate, it is difficult to form a metal layer on the portion of the inner surface by, for example, a vapor deposition such as evaporation or sputtering. Because the metal layer is formed on the insulating layer on the inner surface of the through hole with the boron layer interposed therebetween, even in such a case, the metal layer is stably formed on the inner surface of the through hole, and electrical connection in the through-wiring pattern is reliably achieved.

In the wiring structural body according to one embodiment of the present disclosure, the width of the through hole may be 10 μm or more and 100 μm or less. Because the metal layer is formed on the insulating layer on the inner surface of the through hole with the boron layer interposed therebetween, even in such a fine through hole, the metal layer is stably formed on the inner surface of the through hole, and electrical connection in the through-wiring pattern is reliably achieved. The width of the through hole is a width in a direction perpendicular to a penetration direction. For example, in a case where the through hole has a cylindrical shape, the width of the through hole is a diameter of the cylinder, and in a case where the through hole has a quadrangular prism shape, the width of the through hole is a distance between facing two sides.

In the wiring structural body according to one embodiment of the present disclosure, the metal layer may be a plating layer. This configuration is based on the findings that the present inventors have found that the metal layer is selectively and isotropically formed on the boron layer by plating. As a result, by forming the boron layer on the insulating layer on the inner surface of the through hole, it is possible to reliably form the metal layer on the insulating layer on the inner surface of the through hole with the boron layer interposed therebetween without depending on the shape of the through hole. Therefore, electrical connection in the through-wiring pattern is more reliably achieved.

In the wiring structural body according to one embodiment of the present disclosure, the silicon substrate may constitute an interposer. According to this configuration, it is possible to obtain an interposer in which electrical connection in the through-wiring pattern is reliably achieved.

In the wiring structural body according to one embodiment of the present disclosure, the silicon substrate may constitute a semiconductor device. According to this configuration, it is possible to obtain a semiconductor device in which electrical connection in the through-wiring pattern is reliably achieved.

According to another aspect of the present disclosure, there is provided a method for producing a wiring structural body provided with a wiring pattern including a through-wiring pattern, the method including: a first step of forming a through hole in which the through-wiring pattern is disposed on a silicon substrate; a second step of forming an insulating layer on a surface of the silicon substrate including an inner surface of the through hole along at least a region for forming the wiring pattern; a third step of forming a boron layer on the insulating layer along the region; and a fourth step of forming a metal layer on the boron layer by plating.

In the method for producing a wiring structural body according to one embodiment of the present disclosure, a metal layer is formed on the insulating layer on the inner surface of the through hole with a boron layer interposed therebetween. Therefore, it is possible to obtain a wiring structural body in which electrical connection in the through-wiring pattern is reliably achieved. In addition, in the method for producing the wiring structural body, a metal layer is formed on the boron layer by plating. This configuration is based on the findings that the present inventors have found that the metal layer is selectively and isotropically formed on the boron layer by plating. As a result, in the method for producing the wiring structural body, it is possible to easily produce a wiring structural body in which electrical connection in the through-wiring pattern is reliably achieved.

In the method for producing the wiring structural body according to one embodiment of the present disclosure, in the third step, a boron layer may be isotropically formed on the insulating layer by a vapor deposition, and after that, the boron layer may be patterned along the region. According to this configuration, it is possible to accurately and easily form the boron layer along the region.

Advantageous Effects of Invention

According to one embodiment of the present disclosure, it is possible to provide a wiring structural body in which electrical connection in a through-wiring pattern is reliably achieved and a method for producing the wiring structural body capable of easily producing such a wiring structural body.

DESCRIPTION OF EMBODIMENTS

Figure 1:
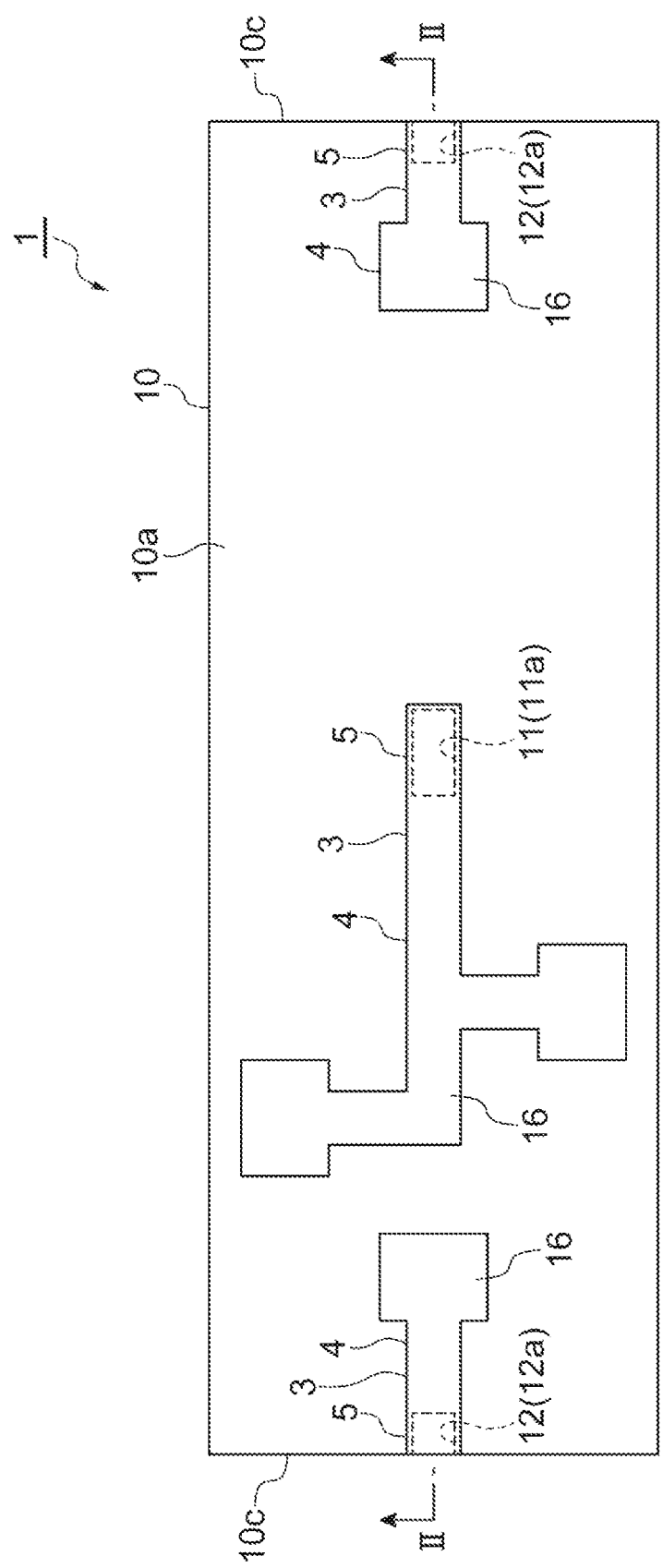
FIG. 1 is a plan view of an interposer which is an embodiment of a wiring structural body according to the present disclosure.

Hereinafter, an embodiment of the present disclosure will be described in detail with reference to the drawings. In each figure, the same or corresponding components are denoted by the same reference numerals, and redundant description is omitted.

Figure 2:
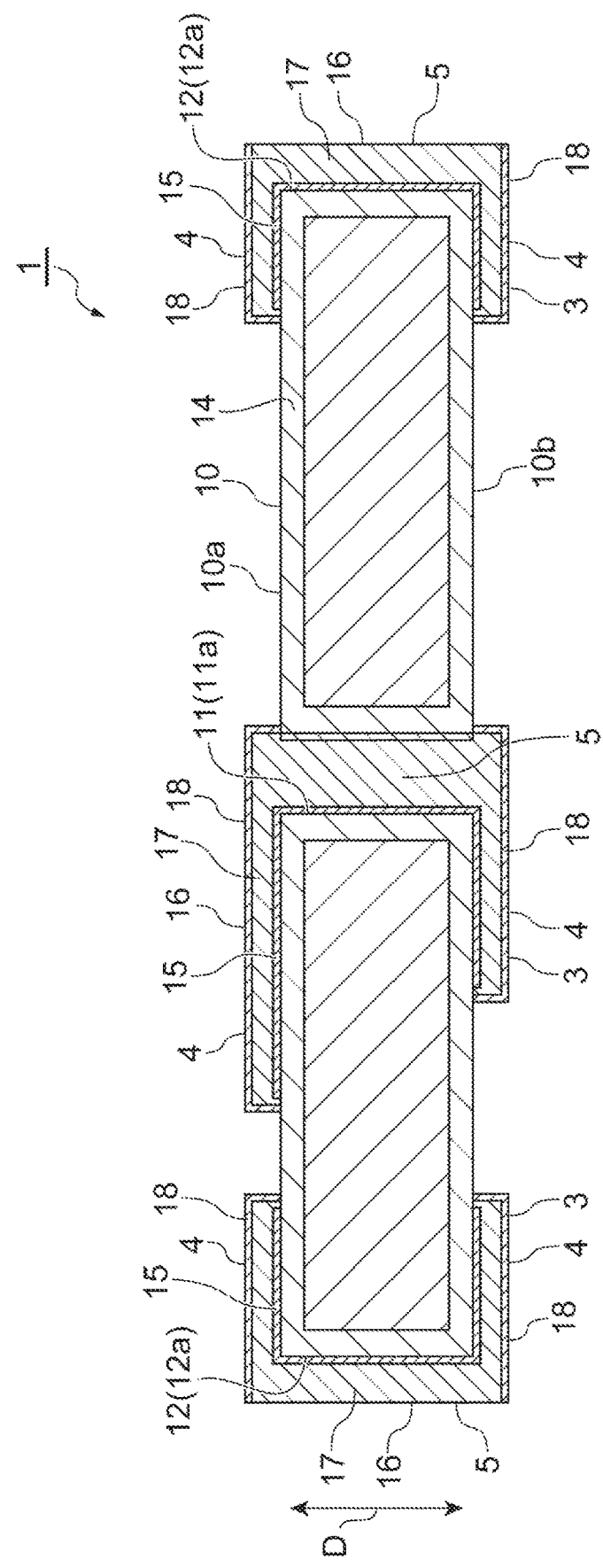
FIG. 2 is a cross-sectional view taken along line II-II of the interposer of FIG. 1.

An interposer (wiring structural body) 1 illustrated in FIGS. 1 and 2 is, for example, a relay substrate used for relaying electrical connection between electronic components having different terminal pitches. The interposer 1 includes a rectangular plate-shaped silicon substrate 10 made of a silicon (Si) crystal. A wiring pattern 3 having a predetermined shape is provided on the silicon substrate 10. The wiring pattern 3 includes a surface wiring pattern 4 provided along a first principal surface 10a and a second principal surface 10b of the silicon substrate 10 and a through-wiring pattern 5 connecting the surface wiring pattern 4 on the first principal surface 10a side and the surface wiring pattern 4 on the second principal surface 10b side. In FIGS. 1 and 2, the wiring pattern 3 is schematically illustrated in a simple shape, but actually, the wiring pattern 3 is formed accurately to have a complicated shape.

The silicon substrate 10 is provided with a through hole 11 penetrating the silicon substrate 10 and being opened to the first principal surface 10a and the second principal surface 10b of the silicon substrate 10. A through-wiring pattern 5 is disposed in the through hole 11. The through hole 11 has a quadrangular prism shape extending along a thickness direction D of the silicon substrate 10. A width of the through hole 11 is, for example, 10 µm or more and 100 µm or less. The width of the through hole 11 is a width in a direction perpendicular to a penetration direction, and herein, the width of the through hole is a distance between facing two sides. An inner surface 11a of the through hole 11 is entirely along the thickness direction D and intersects the first principal surface 10a and the second principal surface 10b at right angles.

FIGS. 1 and 2 also schematically illustrate the through hole 11 in a simple shape, but actually, a plurality of the through holes 11 are provided. For example, in addition to the vertical holes as described above, the through holes 11 having various shapes such as inclined holes of which penetration directions are inclined with respect to the thickness direction D and bent holes having bent portions may be provided. The inner surface 11a of the through hole 11 may have a portion along the thickness direction D as described above and a portion along the direction intersecting the thickness direction D and may have a tapered portion. Alternatively, the entire inner surface 11a may be formed to have a tapered shape.

In addition, at least a portion of the inner surface 11a of the through hole 11 may be along a direction intersecting the thickness direction D. For example, the entire inner surface 11a of the through hole 11 may be along the direction intersecting the thickness direction D (inclined hole). Alternatively, the through hole 11 may have a first portion where the inner surface 11a is along the first direction and a second portion where the inner surface 11a is along the second direction which intersects the first direction and the thickness direction D (bent hole).

In the silicon substrate 10, each of a pair of side surfaces 10c and 10c that face each other is provided with a depression 12. The depression 12 is formed by cutting a silicon wafer W (refer to FIG. 3) on which the through holes 11 are formed, along dicing lines L passing through the through holes 11 as described later. The depression 12 has a quadrangular prism shape that bisects the through hole 11 along a plane that passes through the center of the through hole 11 and is parallel to the side surface 10c.

In the silicon substrate 10, an insulating layer 14 is provided on the first principal surface 10a, the second principal surface 10b, the inner surface 11a of the through hole 11, and the inner surface 12a of the depression 12. The insulating layer 14 is, for example, a silicon oxide film formed by performing thermal oxidation treatment on the surface of the silicon substrate 10. The insulating layer 14 has a thickness of, for example, 1.0 µm or less.

A boron layer 15 is provided on the insulating layer 14. The boron layer 15 is formed along the wiring pattern 3. That is, the boron layer 15 is formed on the insulating layer 14 on the first principal surface 10a and the second principal surface 10b along the surface wiring pattern 4 and is formed on the insulating layer 14 on the inner surface 11a of the through hole 11 and the inner surface 12a of the depression 12 along the through-wiring pattern 5. In this example, the boron layer 15 is formed over the entire surface of the insulating layer 14 on the inner surface 11a and the inner surface 12a. The boron layer 15 formed on the insulating layer 14 on the inner surface 11a and the inner surface 12a is continuous with the boron layer 15 formed on the insulating layer 14 on the first principal surface 10a and the second principal surface 10b. The boron layer 15 is isotropically formed with a thickness of several nanometers to several tens of nanometers by a vapor deposition such as a chemical vapor deposition (CVD) epitaxial growth.

A metal layer 16 is formed on the boron layer 15. The metal layer 16 has a thickness of, for example, several micrometers to several tens of micrometers. The metal layer 16 is formed on the boron layer 15 on the first principal surface 10a and the second principal surface 10b along the surface wiring pattern 4 and is formed on the boron layer 15 on the inner surface 11a of the through hole 11 and the inner surface 12a of the depression 12 along the through-wiring pattern 5. In this example, the metal layer 16 is buried in the through hole 11 and filled in the through hole 11 without a gap.

The metal layer 16 is, for example, a plating layer isotropically formed on the boron layer 15 by plating. An example of plating, electroless metal plating may be exemplified. The metal layer 16 is configured by forming a gold layer 18 made of gold and having a thickness of about 0.05 µm on the nickel layer 17 made of nickel and having a thickness of about 5 µm or about 10 µm by, for example, electroless Ni/Au plating. As described above, because the depression 12 is formed by cutting the through hole 11, in the metal layer 16 in the depression 12, the gold layer 18 is not formed on the nickel layer 17, and the nickel layer 17 is exposed to the outer surface. In addition, it is the findings that the present inventors have found that the metal layer 16 is stably formed on the boron layer 15 and that the metal layer 16 is selectively and isotropically formed on the boron layer 15 by plating.

Next, a method for producing an interposer 1 will be described with reference to FIGS. 3 to 9(b). In addition, in FIGS. 4(a) to 9(b), FIGS. 4(a), 5(a), 6(a), 7(a), 8(a), and 9(a) are plan views, and FIGS. 4(b), 5(b), 6(b), 7(b), 8(b), and 9(b) are cross-sectional views taken along line B-B.

Figure 3:
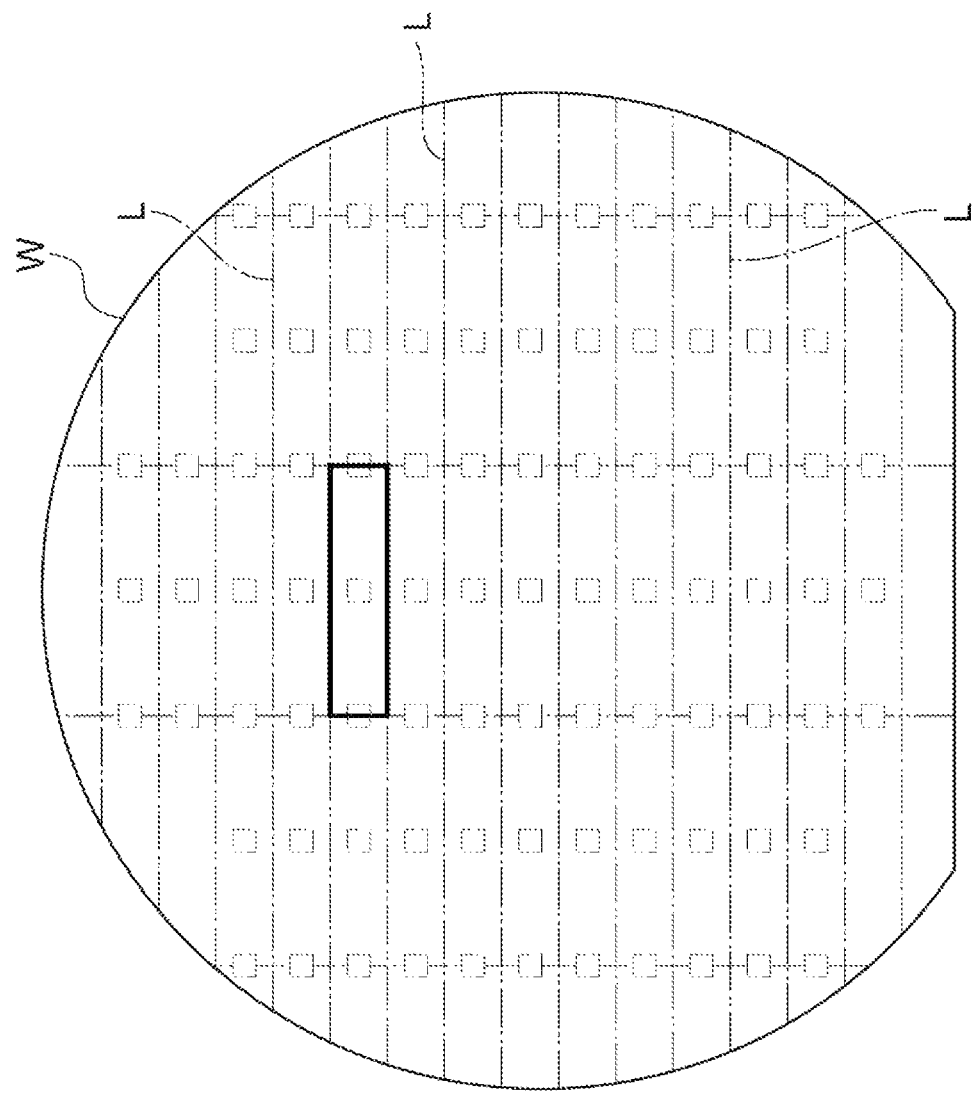
FIG. 3 is a view illustrating the method for producing the interposer of FIG. 1.
Figure 4:
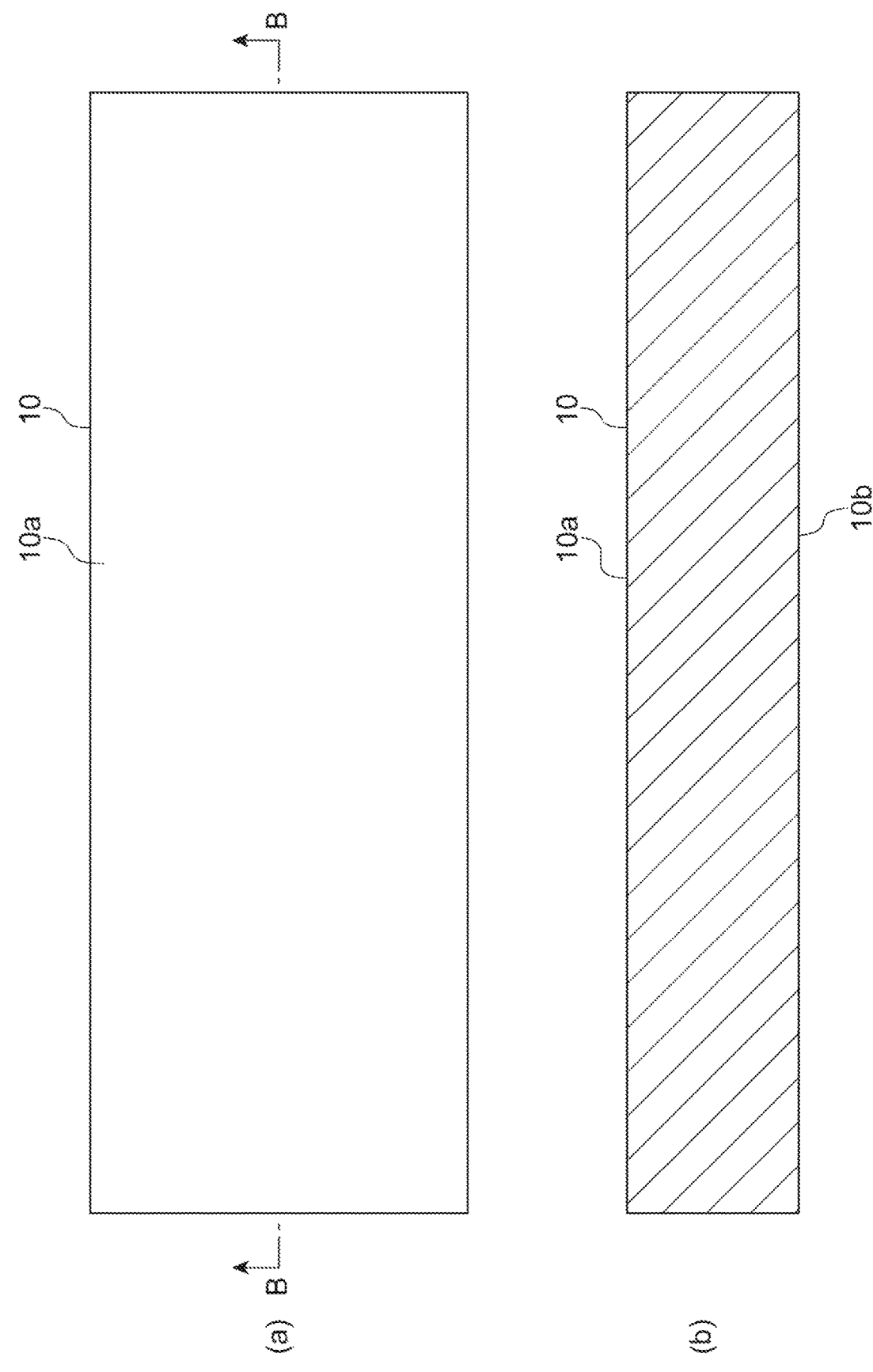
FIGS. 4(a) and 4(b) are views illustrating the method for producing the interposer of FIG. 1.
Figure 5:
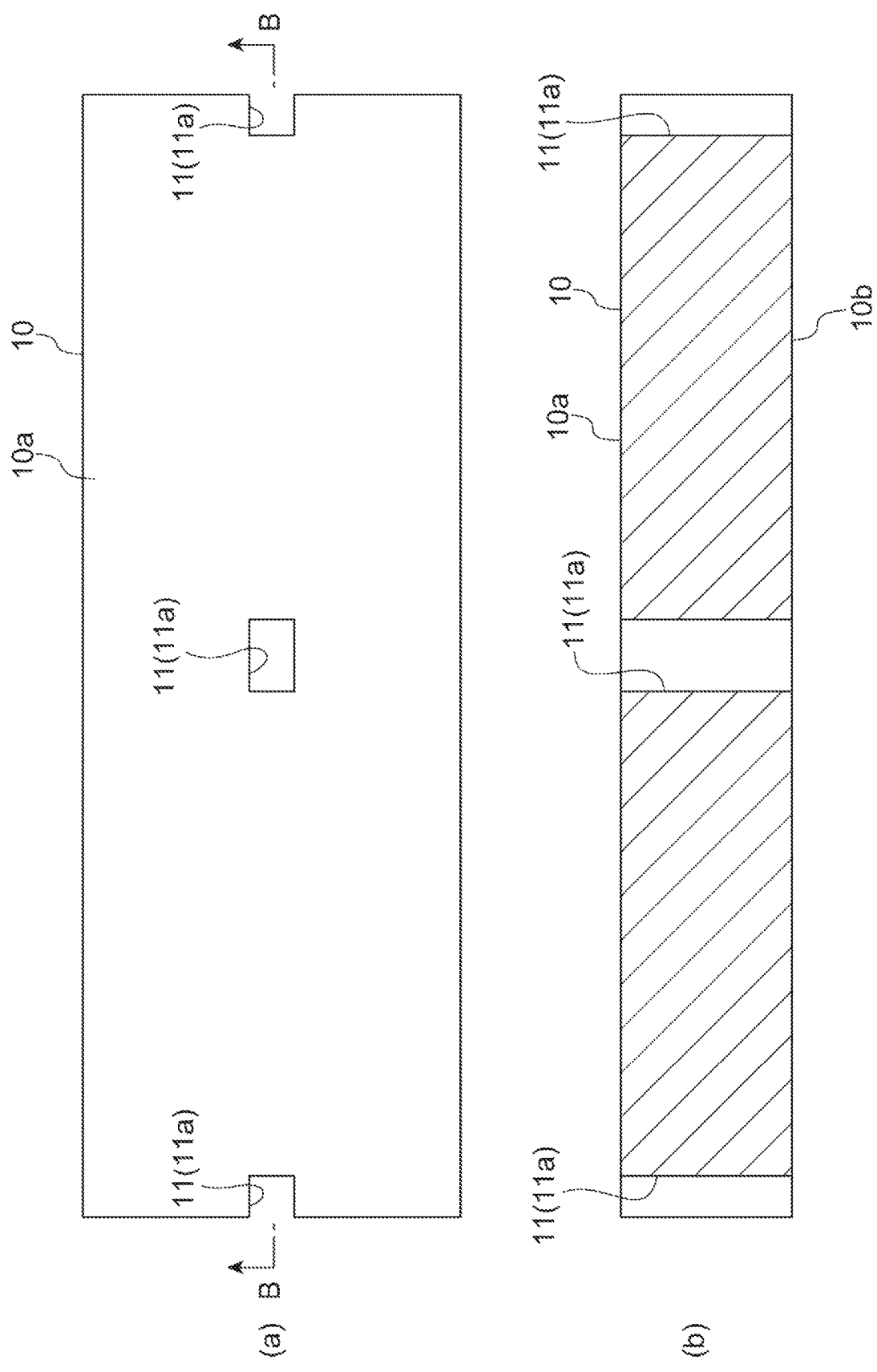
FIGS. 5(a) and 5(b) are views illustrating the method for producing the interposer of FIG. 1.
Figure 6:
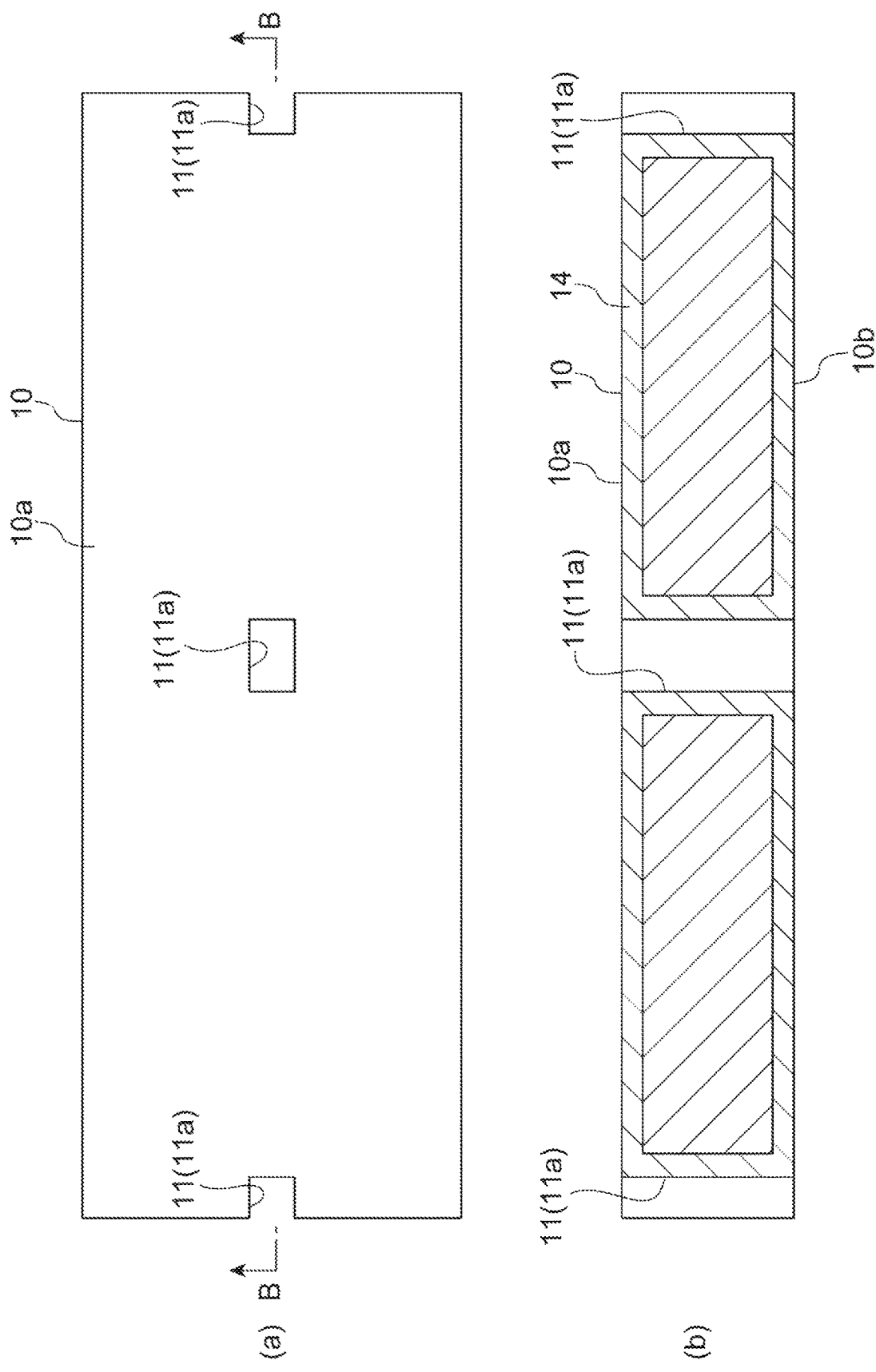
FIGS. 6(a) and 6(b) are views illustrating the method for producing the interposer of FIG. 1.
Figure 7:
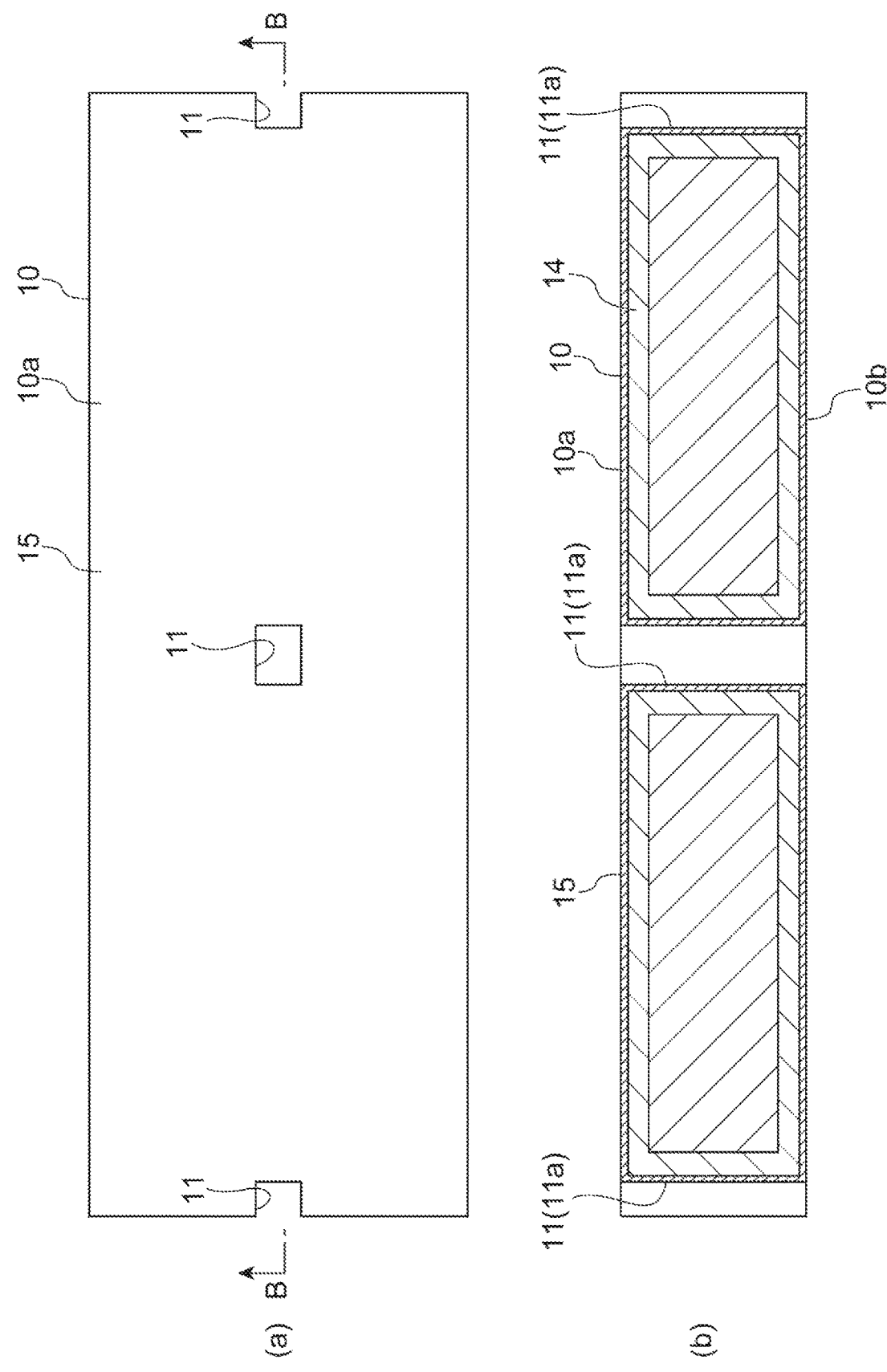
FIGS. 7(a) and 7(b) are views illustrating the method for producing the interposer of FIG. 1.
Figure 8:
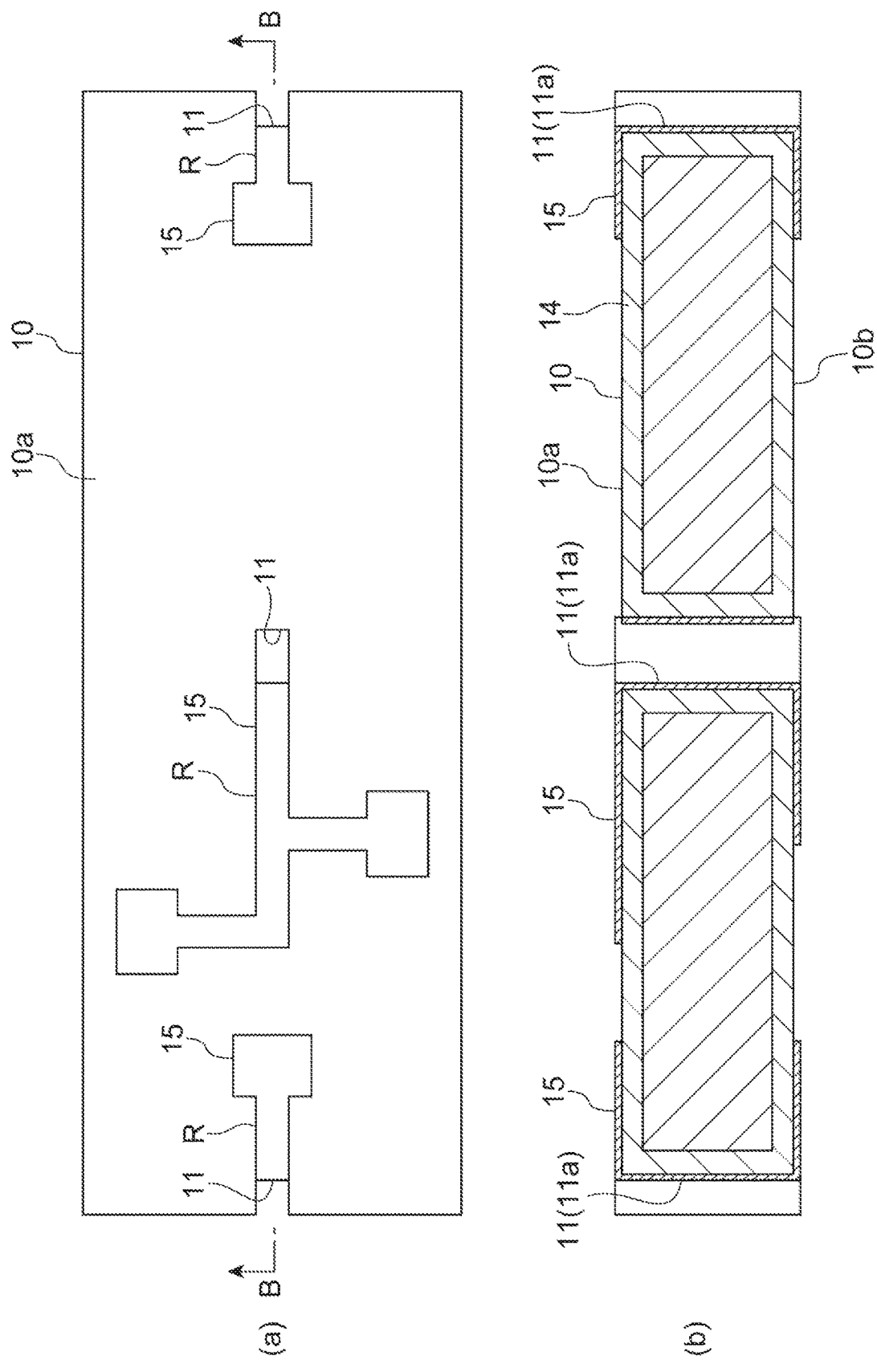
FIGS. 8(a) and 8(b) are views illustrating the method for producing the interposer of FIG. 1.
Figure 9:
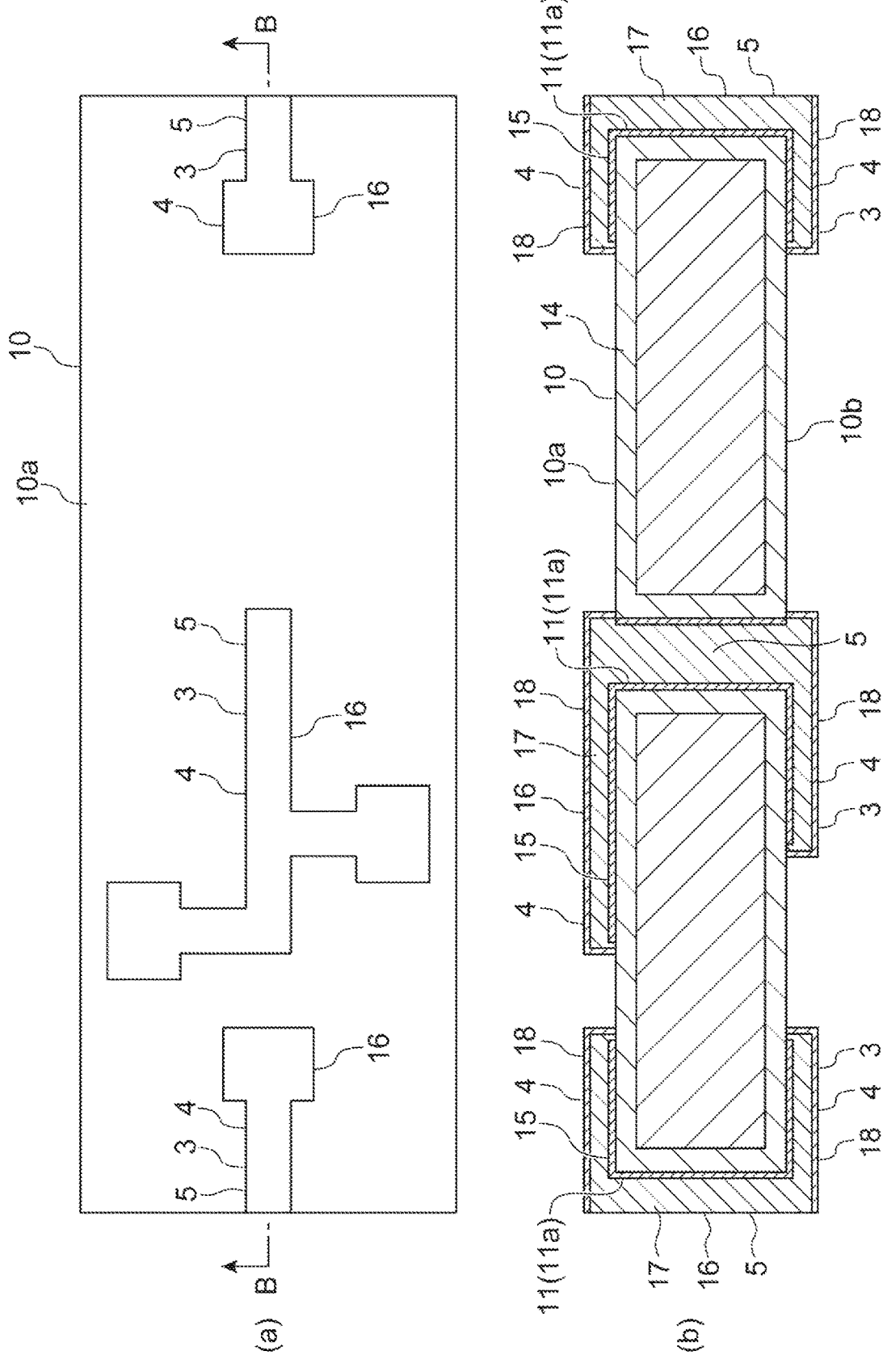
FIGS. 9(a) and 9(b) are views illustrating the method for producing the interposer of FIG. 1.

As illustrated in FIG. 3, a silicon wafer W for obtaining a plurality of interposers 1 by cutting along dicing lines L set in a grid shape is prepared. A portion indicated by a thick line in FIG. 3 is to be an interposer 1. Hereinafter, the method for producing the interposer 1 will be described focusing on the thick-line portion.

First, as illustrated in FIGS. 4(a) and 4(b), a silicon substrate 10 (silicon wafer W) is prepared. Subsequently, as illustrated in FIGS. 5(a) and 5(b), a through hole 11 is formed in the silicon substrate 10 by reactive ion etching or the like (first step). Subsequently, as illustrated in FIGS. 6(a) and 6(b), by performing thermal oxidation treatment on a surface of the silicon substrate 10, an insulating layer 14 is formed on a first principal surface 10a and a second principal surface 10b of the silicon substrate 10 and an inner surface 11a of the through hole 11 (including an inner surface 12a of a depression 12 after cutting) (second step).

Subsequently, as illustrated in FIGS. 7(a) and 7(b), a boron layer 15 is isotropically formed on the first principal surface 10a and the second principal surface 10b of the silicon substrate 10 and the inner surface 11a of the through hole 11 by CVD epitaxial growth (third step). Subsequently, as illustrated in FIGS. 8(a) and 8(b), the boron layer 15 is patterned along a region R of a wiring pattern 3 by dry etching (third step).

Subsequently, as illustrated in FIGS. 9(a) and 9(b), a metal layer 16 is selectively and isotropically formed on the boron layer 15 by plating (fourth step). More specifically, a nickel layer 17 is formed on the boron layer 15 by plating, and after that, a gold layer 18 is formed on the nickel layer 17 by plating. Accordingly, the wiring pattern 3 including a surface wiring pattern 4 and a through-wiring pattern 5 is formed. Finally, the silicon wafer W is cut along the dicing lines L to obtain the interposers 1.

As described above, in the interposer 1, the metal layer 16 is formed on the insulating layer 14 on the inner surface 11a of the through hole 11 with the boron layer 15 interposed therebetween. This configuration is based on the findings that the present inventors have found that the metal layer 16 is stably formed on the boron layer 15. As a result, in the interposer 1, electrical connection in the through-wiring pattern 5 is reliably achieved.

In the interposer 1, the inner surface 11a of the through hole 11 is along the thickness direction D. In a case where the inner surface 11a is along the thickness direction D, it is difficult to form the metal layer 16 on the inner surface 11a by, for example, a vapor deposition such as evaporation. Because the metal layer 16 is formed on the insulating layer 14 on the inner surface 11a with the boron layer 15 interposed therebetween, even in such a case, the metal layer 16 is stably formed on the inner surface 11a, and electrical connection in the through-wiring pattern 5 is reliably achieved.

In the interposer 1, the inner surface 11a of the through hole 11 is along a direction intersecting the thickness direction D. In a case where the inner surface 11a is along a direction intersecting the thickness direction D, it is difficult to form the metal layer 16 on the inner surface 11a by, for example, a vapor deposition such as evaporation. Because the metal layer 16 is formed on the insulating layer 14 on the inner surface 11a with the boron layer 15 interposed therebetween, even in such a case, the metal layer 16 is stably formed on the inner surface 11a, and electrical connection in the through-wiring pattern 5 is reliably achieved.

In the interposer 1, the width of the through hole 11 is 10 µm or more and 100 µm or less. Because the metal layer 16 is formed on the insulating layer 14 on the inner surface 11a of the through hole 11 with the boron layer 15 interposed therebetween, even in such a fine through hole 11, the metal layer 16 is stably formed on the inner surface 11a of the through hole 11, and electrical connection in the through-wiring pattern 5 is reliably achieved.

In the interposer 1, the metal layer 16 is a plating layer. This configuration is based on the findings that the present inventors have found that the metal layer 16 is selectively and isotropically formed on the boron layer 15 by plating. As a result, by forming the boron layer 15 on the insulating layer 14 on the inner surface 11a of the through hole 11, it is possible to reliably form the metal layer 16 on the insulating layer 14 on the inner surface 11a of the through hole 11 with the boron layer 15 interposed therebetween without depending on the shape of the through hole 11 or the like. Therefore, electrical connection in the through-wiring pattern 5 is more reliably achieved.

In the interposer 1, the silicon substrate 10 constitutes the interposer 1. Therefore, it is possible to obtain the interposer 1 in which electrical connection in the through-wiring pattern 5 is reliably achieved.

In the method for producing the interposer 1, the metal layer 16 is formed on the insulating layer 14 on the inner surface 11a of the through hole 11 with the boron layer 15 interposed therebetween. Therefore, it is possible to obtain the interposer 1 in which electrical connection in the through-wiring pattern 5 is reliably achieved. In addition, in the method for producing the interposer 1, the metal layer 16 is formed on the boron layer 15 by plating. This configuration is based on the findings that the present inventors have found that the metal layer 16 is selectively and isotropically formed on the boron layer 15 by plating. As a result, in the method for producing the interposer 1, it is possible to easily produce the interposer 1 in which electrical connection in the through-wiring pattern 5 is reliably achieved.

In the method for producing the interposer 1, the boron layer 15 is isotropically formed on the insulating layer 14 by CVD epitaxial growth, and after that, the boron layer 15 is patterned along the region R. Therefore, it is possible to accurately and easily form the boron layer 15 along the region R.

For example, in the case of using a vapor deposition such as evaporation or sputtering, in order to facilitate formation of the metal layer 16 on the insulating layer 14, it is necessary to form the inner surface 11a of the through hole 11 in, for example, a tapered shape. On the contrary, in the method for producing the interposer 1, because the metal layer 16 can be selectively and isotropically formed on the boron layer 15 by plating, even in a case where the inner surface 11a is along the thickness direction D, it is possible to stably form the metal layer 16 on the inner surface 11a. As a result, it is not necessary to form the inner surface 11a in a tapered shape, and it is possible to easily produce the interposer 1 having a finer through-wiring pattern 5.

Heretofore, although one embodiment of the present disclosure has been described above, one embodiment of the present disclosure is not limited to the above-described embodiment. For example, in the above-described embodiment, although the insulating layer 14 is a silicon oxide film formed by performing thermal oxidation treatment on the surface of the silicon substrate 10, the insulating layer may be stacked on the surface of the silicon substrate 10. The insulating layer 14 may be formed on the surface of the silicon substrate 10 including the inner surface 11a of the through hole 11 along at least the wiring pattern 3 (region R). The insulating layer 14 may be formed only in the region along the wiring pattern 3.

The metal layer 16 may not be embedded in the through hole 11 and may be provided on the boron layer 15 on the inner surface 11a of the through hole 11 so that a gap is formed in the through hole 11. For example, the metal layer 16 may be provided so as to form a gap that is opened to the first principal surface 10a side and the second principal surface 10b side of the silicon substrate 10 in the through hole 11.

In the above-described embodiment, the silicon substrate 10 constitutes the interposer 1. However, the silicon substrate 10 may constitute a semiconductor device (for example, an optical semiconductor element such as an image sensor). In this case, the through-wiring pattern 5 electrically connects, for example, an electrode which is the surface wiring pattern 4 on the first principal surface 10a side and a mounting pad which is the surface wiring pattern 4 on the second principal surface 10b side. In the case of application to an image sensor, from the viewpoint of suppressing a dark current, it is preferable that the boron layer 15 is disposed in the vicinity of a light receiving portion. In a case where the silicon substrate 10 constitutes a semiconductor device, it is preferable that the metal layer 16 is formed by electroless metal plating in order to avoid electric breakdown.

REFERENCE SIGNS LIST

1: interposer (wiring structural body), 3: wiring pattern, 5: through-wiring pattern, 10: silicon substrate, 11: through hole, 11a: inner surface of through hole, 14: insulating layer, 15: boron layer, 16: metal layer, D: thickness direction, R: region for forming wiring pattern.

The invention claimed is:

1. A wiring structural body provided with a wiring pattern including a through-wiring pattern, the wiring structural body comprising:
   a silicon substrate having a through hole in which the through-wiring pattern is disposed;
   an insulating layer provided on a surface of the silicon substrate including an inner surface of the through hole along at least the wiring pattern;
   a boron layer consisting of boron provided on the insulating layer along the wiring pattern; and
   a metal layer provided on the boron layer.

2. The wiring structural body according to claim 1, wherein at least a portion of the inner surface of the through hole is along a thickness direction of the silicon substrate.

3. The wiring structural body according to claim 1, wherein at least a portion of the inner surface of the through hole is along a direction intersecting a thickness direction of the silicon substrate.

4. The wiring structural body according to claim 1, wherein a width of the through hole is in a range of 10 μm or more and 100 μm or less.

5. The wiring structural body according to claim 1, wherein the metal layer is a plating layer.

6. The wiring structural body according to claim 1, wherein the silicon substrate constitutes an interposer.

7. The wiring structural body according to claim 1, wherein the silicon substrate constitutes a semiconductor device.

8. A method for producing a wiring structural body provided with a wiring pattern including a through-wiring pattern, the method comprising:
   forming a through hole in which the through-wiring pattern is disposed on a silicon substrate;
   forming an insulating layer on a surface of the silicon substrate including an inner surface of the through hole along at least a region for forming the wiring pattern;
   forming a boron layer consisting of boron on the insulating layer along the region; and
   forming a metal layer on the boron layer by plating.

9. The method according to claim 8, wherein, in forming the boron layer, the boron layer is isotropically formed on the insulating layer by a vapor deposition, and after that, the boron layer is patterned along the region.

* * * * *